United States Patent
Akin et al.

(10) Patent No.: US 10,068,636 B2
(45) Date of Patent: Sep. 4, 2018

(54) APPARATUSES AND METHODS FOR ACCESSING AND SCHEDULING BETWEEN A PLURALITY OF ROW BUFFERS

(71) Applicant: Intel Corporation, Santa Clara, CA (US)

(72) Inventors: Berkin Akin, Hillsboro, OR (US); Shigeki Tomishima, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/394,860

(22) Filed: Dec. 30, 2016

(65) Prior Publication Data
US 2018/0190339 A1    Jul. 5, 2018

(51) Int. Cl.
| | | |
|---|---|---|
| G11C 7/22 | (2006.01) | |
| G11C 11/4093 | (2006.01) | |
| G11C 11/4091 | (2006.01) | |
| G11C 11/4094 | (2006.01) | |

(52) U.S. Cl.
CPC .......... G11C 11/4093 (2013.01); G11C 7/22 (2013.01); G11C 11/4091 (2013.01); G11C 11/4094 (2013.01)

(58) Field of Classification Search
CPC .................................. G11C 7/22; G11C 8/12
USPC ........................ 365/189.05, 230.03
See application file for complete search history.

(56) References Cited

U.S. PATENT DOCUMENTS

| | | | | | |
|---|---|---|---|---|---|
| 5,305,280 | A * | 4/1994 | Hayano | ............... | G06F 12/0893 365/189.04 |
| 5,701,095 | A * | 12/1997 | Ohsawa | ............... | G11C 7/1048 326/121 |
| 5,831,924 | A * | 11/1998 | Nitta | ........................ | G11C 7/18 365/189.17 |
| 6,154,385 | A * | 11/2000 | Fukuzo | ................. | G11C 7/1051 365/230.08 |
| 6,178,479 | B1 * | 1/2001 | Vishin | ................. | G06F 12/0893 365/222 |
| 6,311,280 | B1 * | 10/2001 | Vishin | ................. | G06F 12/0862 365/222 |
| 6,799,291 | B1 * | 9/2004 | Kilmer | .................... | G11C 29/40 714/722 |
| 2002/0031035 | A1 * | 3/2002 | Tsuji | ........................ | G11C 8/12 365/230.03 |
| 2002/0159288 | A1 * | 10/2002 | Sunaga | ................... | G11C 11/15 365/171 |
| 2003/0214845 | A1 * | 11/2003 | Yamazaki | .......... | G11C 29/1201 365/189.04 |

(Continued)

OTHER PUBLICATIONS

Hidaka Hideto et al: "The cache DRAM architecture: A DRAM with an on-chipcache memory" Micro,IEEE10.2(1990):14-25.

(Continued)

*Primary Examiner* — Michael Tran
(74) *Attorney, Agent, or Firm* — 2SPL Patentanwaelte Part G mbB; Mani Arabi

(57) ABSTRACT

The present disclosure relates to a dynamic random access memory (DRAM) array, which comprises a plurality of bit lines connectable, respectively, to at least two row buffers of the DRAM array. The two row buffers are respectively connectable to data input/output (I/O) lines and are configured to electrically connect the two row buffers to the bit lines and data I/O lines in a mutually exclusive manner.

14 Claims, 11 Drawing Sheets

(56) References Cited

U.S. PATENT DOCUMENTS

| | | | | |
|---|---|---|---|---|
| 2003/0231535 | A1* | 12/2003 | Pfeiffer | G11C 11/4085 365/200 |
| 2006/0209611 | A1* | 9/2006 | Tsukude | G11C 11/406 365/222 |
| 2008/0195894 | A1* | 8/2008 | Schreck | G06F 11/1056 714/34 |
| 2008/0232185 | A1* | 9/2008 | Bartley | G11C 7/1012 365/227 |
| 2009/0073795 | A1* | 3/2009 | Pyeon | G11C 5/145 365/228 |
| 2009/0083565 | A1* | 3/2009 | Johnson | G06F 13/4243 713/400 |
| 2009/0086551 | A1* | 4/2009 | Ide | G06F 11/1004 365/189.03 |
| 2012/0026797 | A1* | 2/2012 | Kim | G11C 16/0483 365/185.18 |
| 2013/0111147 | A1* | 5/2013 | Mogul | G06F 12/0802 711/137 |
| 2013/0163353 | A1* | 6/2013 | Hiraishi | G11C 7/222 365/193 |
| 2014/0063915 | A1* | 3/2014 | Cronie | G11C 7/1006 365/149 |
| 2014/0119099 | A1* | 5/2014 | Clark | G11C 5/146 365/149 |
| 2014/0173170 | A1* | 6/2014 | Muralimanohar | G06F 13/16 711/102 |
| 2014/0219036 | A1* | 8/2014 | Kim | H03K 19/00361 365/189.02 |
| 2014/0328122 | A1* | 11/2014 | Barth, Jr. | G11C 11/4085 365/182 |
| 2015/0003172 | A1* | 1/2015 | Kim | G11C 11/40607 365/189.05 |
| 2015/0085580 | A1* | 3/2015 | Wang | G11C 16/08 365/185.18 |
| 2015/0162078 | A1* | 6/2015 | Muralimanohar | G11C 11/56 365/163 |
| 2015/0364191 | A1* | 12/2015 | Muralimanohar | G11C 16/26 365/163 |
| 2016/0284390 | A1* | 9/2016 | Tomishima | G11C 11/4091 |

OTHER PUBLICATIONS

Son Young Hoon et al: "Row-buffer decoupling: a case for low-latency DRAM microarchitecture"; Proceeding of the 41st annual international symposium on Computer architecuture; IEEE Press,2014.

Sato Yasuharu et al: "Fast Cycle RAM (FCRAM); a 20-ns random row access, pipe-lined operating DRAM"; VLSI Circuits,1998. DigestofTechnicalPapers.1998Symposiumon.IEEE,1998.

* cited by examiner

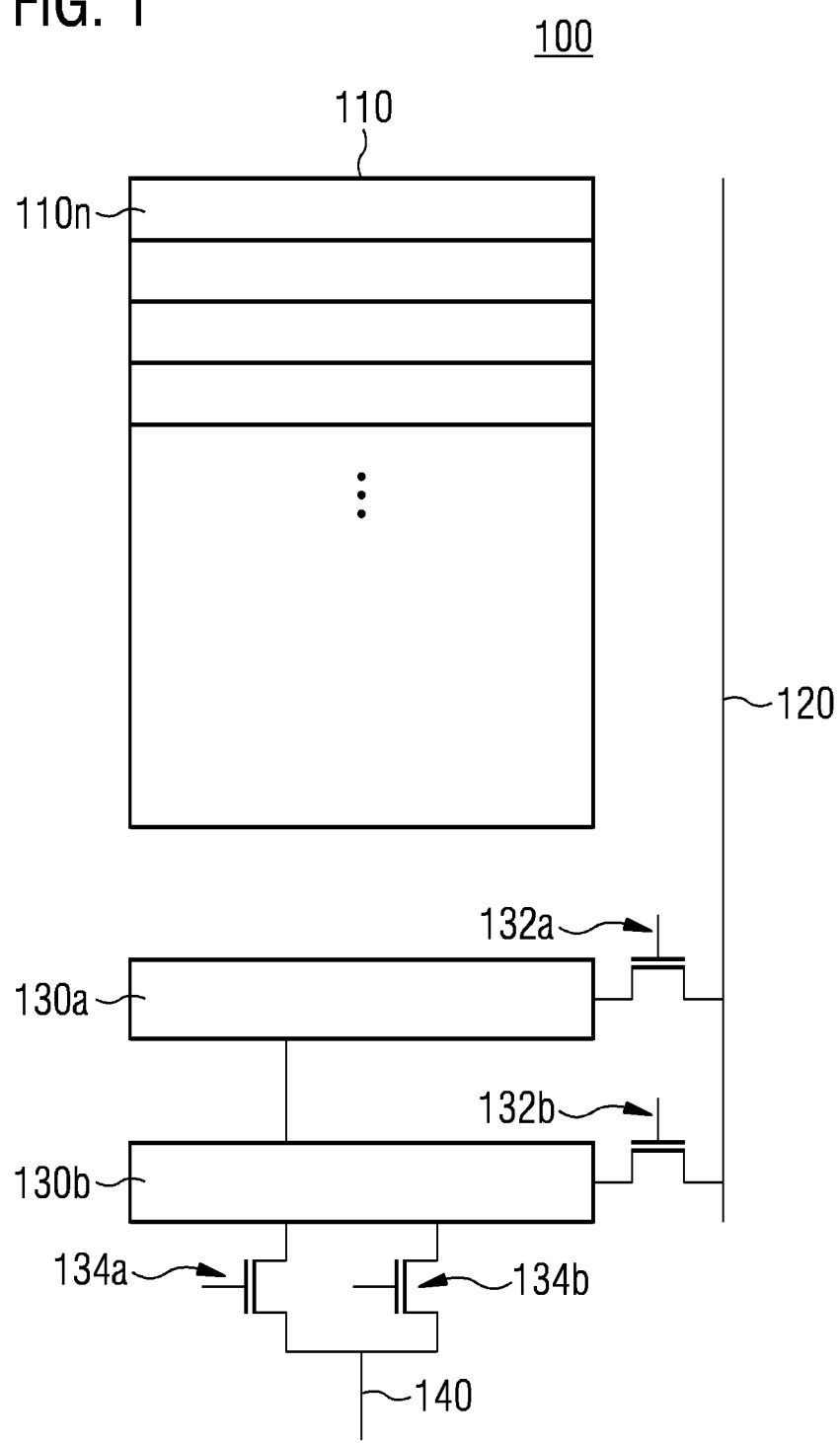

DRB-DRAM Open page miss (Access Row B, Col x, Previous Row A)

DRB-DRAM, Read from Open Page then Page Miss (Read Row B, Col x, then Read Row C, Col y):

DRB-DRAM, Write to Open Page then Page Miss (Write Row B, Col x, then Read Row C, Col y):

APPARATUSES AND METHODS FOR ACCESSING AND SCHEDULING BETWEEN A PLURALITY OF ROW BUFFERS

FIELD

The present disclosure generally relates to computer memory systems and, more particularly, to Dynamic Random Access Memory (DRAM). The present disclosure further relates to methods and interfaces between DRAM and data row buffers, including scheduling of DRAM.

BACKGROUND

Memory systems typically comprise a plurality of Dynamic Random Access Memory (DRAM) integrated circuits, referred to herein as DRAM devices or chips, which are connected to one or more processors via one or more memory channels. On each chip or DRAM die, one or more DRAM banks are formed, which typically work together to respond to a memory request. Typically, in each bank, multiple arrays (also known as subarrays or mats) are formed, each array including a row buffer to act as a cache. Conventional DRAM architectures use a single row buffer for each array in the DRAM.

DRAM is considered dynamic in nature as DRAM cells lose their state over time periodically. Information stored in the rows and columns of the array is "sensed" by bit lines of the DRAM. In order to utilize bit lines in the DRAM, there must be a precharging process.

Based on the conventional DRAM architecture, there are several commands that are serialized due to the limitations of the DRAM design. Specifically, in DRAM bank precharging of bit lines, any precharge command cannot be overlapped with other operations. When scheduling the DRAM architectures, multiple commands, including precharging a row in the array or sensing a row into the single row buffer, are scheduled in a pipeline manner. However, the effective access latency is increased because of the required serialization of commands as a bottleneck is created in the pipeline. Write recovery latency becomes part of the critical path when switching rows after a write.

Thus, there is a need for concepts allowing the reduction of access latency and write recovery latency in DRAM architectures.

BRIEF DESCRIPTION OF THE DRAWINGS

Some examples of apparatuses and/or methods will be described in the following by way of example only, and with reference to the accompanying figures, in which:

FIG. 1 shows an example of a DRAM array;

DESCRIPTION OF EMBODIMENTS

Figure 2A:
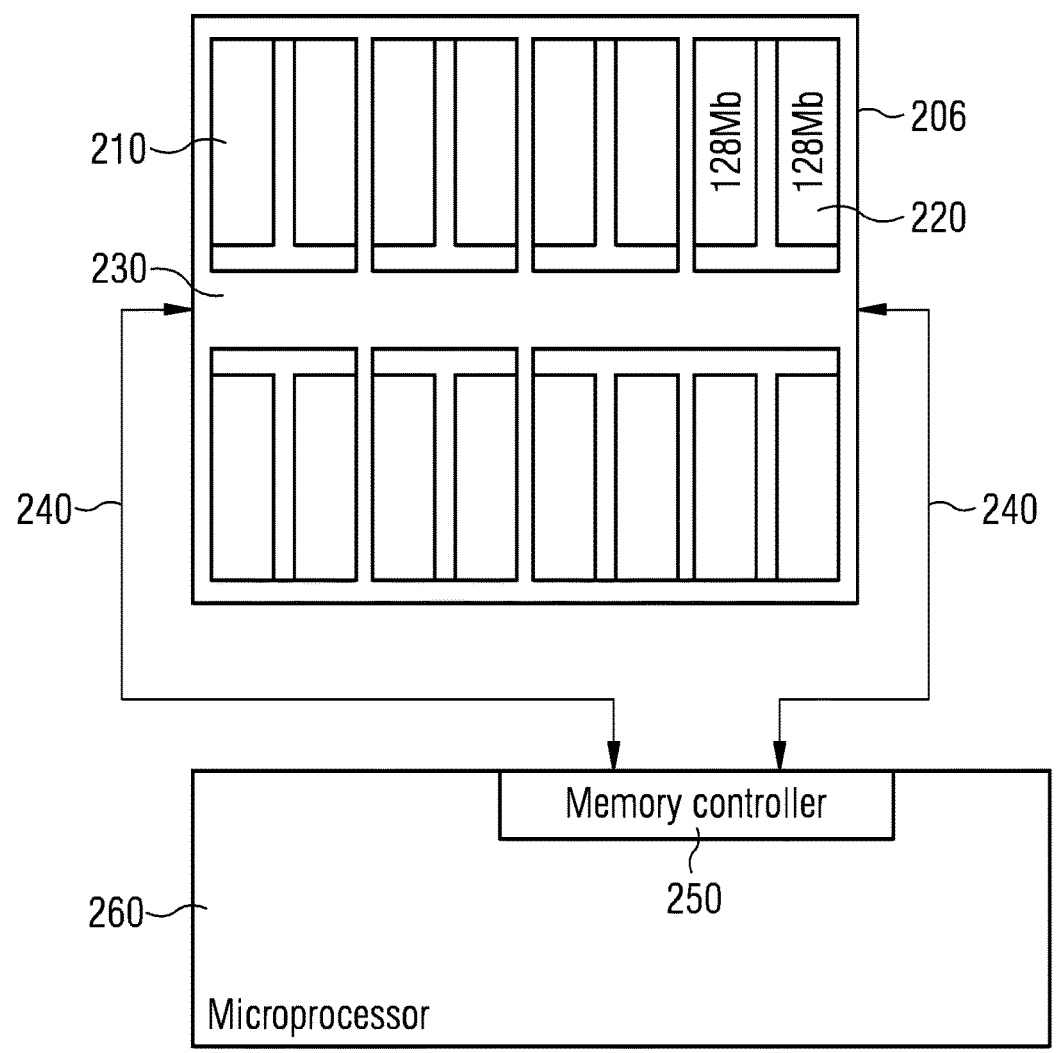
FIG. 2A shows a block diagram of a top hierarchical view of a DRAM system according to an example.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled via one or more intervening elements. If two elements A and B are combined using an "or," this is to be understood as a logical OR function and thus understood to disclose all possible combinations, i.e., "only A," "only B," as well as "A and B." An alternative wording for the same combinations is "at least one of A and B." The same applies for combinations of more than two elements.

The terminology used herein for the purpose of describing particular examples is not intended to be limiting for further examples. Whenever a singular form such as "a," "an," and "the" is used and whenever using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes," and/or "including," when used, specify the presence of the stated features, integers, steps, operations, processes, acts, elements, and/or components, but these terms do not preclude the presence or addition of one or more other features, integers, steps, operations, processes, acts, elements, components, and/or any group thereof.

Unless otherwise defined, all terms (including technical and scientific terms) are used herein in their ordinary meaning of the art to which the examples belong.

In an example, memory circuits include dynamic volatile memory, which may include DRAM (dynamic random access memory), or some variant such as synchronous DRAM (SDRAM). Systems utilizing DRAM as main memory, multi-level memory, caching, etc., may be included.

A memory subsystem as described herein may be compatible with a number of memory technologies, such as DDR3 (dual data rate version 3, original release by JEDEC (Joint Electronic Device Engineering Council) on Jun. 27, 2007, currently on release 21), DDR4 (DDR version 4, initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), and/or others, and technologies based on derivatives or extensions of such specifications.

In one example, non-volatile memory technologies include block addressable memory devices, such as NAND or NOR technologies. Thus, memory technologies can also include future generation non-volatile devices, such as a three-dimensional crosspoint memory device or other byte-addressable nonvolatile memory devices, or memory devices that use chalcogenide-phase change material (e.g., chalcogenide glass). In an example, the memory technologies can be or include multi-threshold level NAND flash memory, NOR flash memory, single or multi-level Phase Change Memory (PCM), a resistive memory, nanowire memory, ferroelectric transistor random access memory (FeTRAM), spin transfer torque (STT)-MRAM, or a combination of any of the above, or other memory.

Generally, a conventional DRAM chip comprises multiple DRAM banks sharing input/output (I/O) means, e.g., I/O pins. Each bank has multiple DRAM cell arrays and each DRAM array has a row buffer. For purposes of the present disclosure, an "array" may also refer to a subarray, mat, or, in aggregate, a bank or subsection of a bank of the DRAM chip.

As a conceptual overview of the present disclosure, FIG. 1 shows an example of a proposed solution to the aforementioned latency issues: a DRAM array with a double row buffer (herein also known as a Double Row Buffer DRAM or DRB-DRAM 100). A DRAM array 110 comprises a plurality of bit lines 120 connectable, respectively, to at least two row buffers 130a, b of the DRAM array 110. The two row buffers may be respectively connectable to data I/O lines.

In a proposed configuration, two row buffers 130a, b (also referred herein as RB0 and RB1 but may not be limited to just two row buffers) may be integrated within the DRAM array and will be used interchangeably so as to provide the role of serving and of backing row buffers, respectively. A serving row buffer is a row buffer connected to input/output. A backing row buffer is a row buffer connected to bit lines. Each of the plurality of bit lines is connectable to the row buffers in that either row buffer may be, at any time, connected to a bit line.

In a proposed configuration, the two row buffers 130a, b are configured to electrically connect the two row buffers 130a, b to the bit lines 120 and data I/O lines 140 in a mutually exclusive manner. That is, the row buffers 130a, b may be either serving row buffers or backing row buffers, but may not be both. Further, only one or the other may fulfill a respective role.

In a proposed configuration, the plurality of bit lines 120 are coupled, respectively, to the two row buffers 130a, b via a bit line access gate transistor 132a, b, whereby when one of the two row buffers 130a, b is electrically connected to a bit line 120, another of the two row buffers is not electrically connected to a bit line.

In a proposed configuration, the plurality of data I/O lines 140 are coupled, respectively, to the two row buffers 130a, b via a data I/O access gate transistor 134a, b, whereby when one of the two row buffers is electrically connected to a data I/O line, another of the two row buffers is not electrically connected to a data I/O line.

Any of the above proposed configurations may be implemented as: a DRAM array; a DRAM chip comprising at least one DRAM array; a DRAM module, comprising a plurality of DRAM chips, etc.

When a new row is being activated within the DRAM array, the row is sensed into a backing row buffer. When the row is sensed in the backing row buffer, the two row buffers change roles (i.e., the serving buffer becomes the backing buffer and vice versa). The serving row buffer thus performs column I/O operations while the backing row buffer restores an updated row to the DRAM array and precharges the bit lines in preparation to sense the next row.

In a proposed configuration, a DRAM module further comprises a signal interface configured to receive: a first micro-operation for sensing a first row of the DRAM array in a row cycle; and a second micro-operation for restoring contents of a second row of the DRAM array in the row cycle. A DRAM controller may be implemented, the DRAM controller configured to issue micro-operations to perform the aforementioned steps of sensing and restoring. However, the issuance of micro-operations may be made internal to the DRAM module.

Row activation is considered to be a disruptive read in the DRB-DRAM system. After a row is sensed, the only valid copy will be in the serving row buffer. The value in the serving row buffer, with any potential updates carried out through the current row cycle, is to be restored back in the DRAM array in a next row cycle. Hence, a single row cycle RAS timing is divided into two sections: sense and restore. That is, in a proposed configuration, the micro-operation for sensing is separable from the micro-operation for restoring in the row cycle.

In a proposed configuration, the micro-operation for sensing senses a first row of the DRAM array with a first row buffer of the DRAM array connected via a bit line in a first row cycle. The micro-operation for restoring may restore contents of a second row buffer to a second row of the DRAM array in the first row cycle.

That is, in a row cycle, when the sense is completed, a restore operation may restore the updated row in the backing row buffer from the previous row cycle to its original location in the DRAM array. This allows for the proposed DRB-DRAM solution to make write recovery timing $T_{WR}$. When there is a subsequent row buffer miss after a write, an example of the DRB-DRAM implementation can skip explicit write recovery, as the updated row in the serving row buffer will be restored in the array in the next row cycle, off the critical path, overlapped with column I/O.

In a proposed configuration, a micro-operation is performed for precharging the bit lines in the first row cycle after restoring contents of the second row buffer to the second row of the DRAM array. A subsequent access request to sense another row is performed after precharging the bit lines of the DRAM array in the first row cycle.

That is, after the restore operation is completed, i.e., the backing row buffer is restored in the array, bit lines and the backing row buffer will be precharged in preparation to sense the next row upon a potential row buffer miss in the serving row buffer. Meanwhile, the serving row buffer will continue to perform column I/O. When the precharge of the bitlines and the row buffer is done, the backing row buffer is ready to sense the next row upon a miss in the serving row buffer, taking precharge timing off the critical path of the row miss. Concurrent to this, a row hit access is still directly served from the serving row buffer.

A proposed DRB-DRAM system has at least an advantage over a conventional DRAM in that the DRB-DRAM architecture allows for overlapping precharge and restore (write recovery) with data I/O.

With reference to FIG. 1, DRB-DRAM 100 (or double row buffer DRAM array) includes an additional row buffer 130b beyond the conventional single row buffer 130a of the DRAM array. According to the example of FIG. 1, the DRB-DRAM 100 includes at least one DRAM array 110. A DRAM array 110 comprises a plurality of rows 110n, where n is a real number. Each row stores columns of cells, which hold data to be read out and written to by a memory system utilizing the DRAM array 110. A plurality of bit lines 120 (or BL 120) are connectable to each row 110n of the DRAM array 110 such that data may be accessed; that is, row data may be read out of the row 110n by a bit line 120 whereby the data on said row 110n degrades.

Before accessing a row 110n, however, the bit lines 120 must be precharged (PRE); precharging a bit line 120 occurs after closing every row. The act of precharging causes a reference voltage $V_{ref}$ to be applied identically on all bit lines. All bit lines are of the same potential. Then, an individual row to be read out is activated by using the voltage of a bit line. The connection of memory cells to bit lines causes the voltage to slightly change. This causes readout. Precharging the bit lines is a prerequisite step to the row access operation subsequently performed.

To read data, an outside signal is given to the DRAM array 100 to activate (ACT) a particular row 110n in the DRAM array 110. The word line (WL) of the corresponding row is activated (ACT), making the bit lines 120 carry data from a respective row 110n. Particularly, cells of the row to be activated discharge their contents onto the bit lines, causing a change of the voltage on the bit line that corresponds to the stored logical content.

The read-out content is stored in a row buffer 130. In an example, the plurality of bit lines 120 are connectable to at least two row buffers 130a, 130b of the DRAM array. The bit lines 120 carry the row data between the DRAM array 110 and the row buffers 130. Data is accessed from the row buffers 130a, b by the system through connection to data I/O lines 140.

Figure 2B:
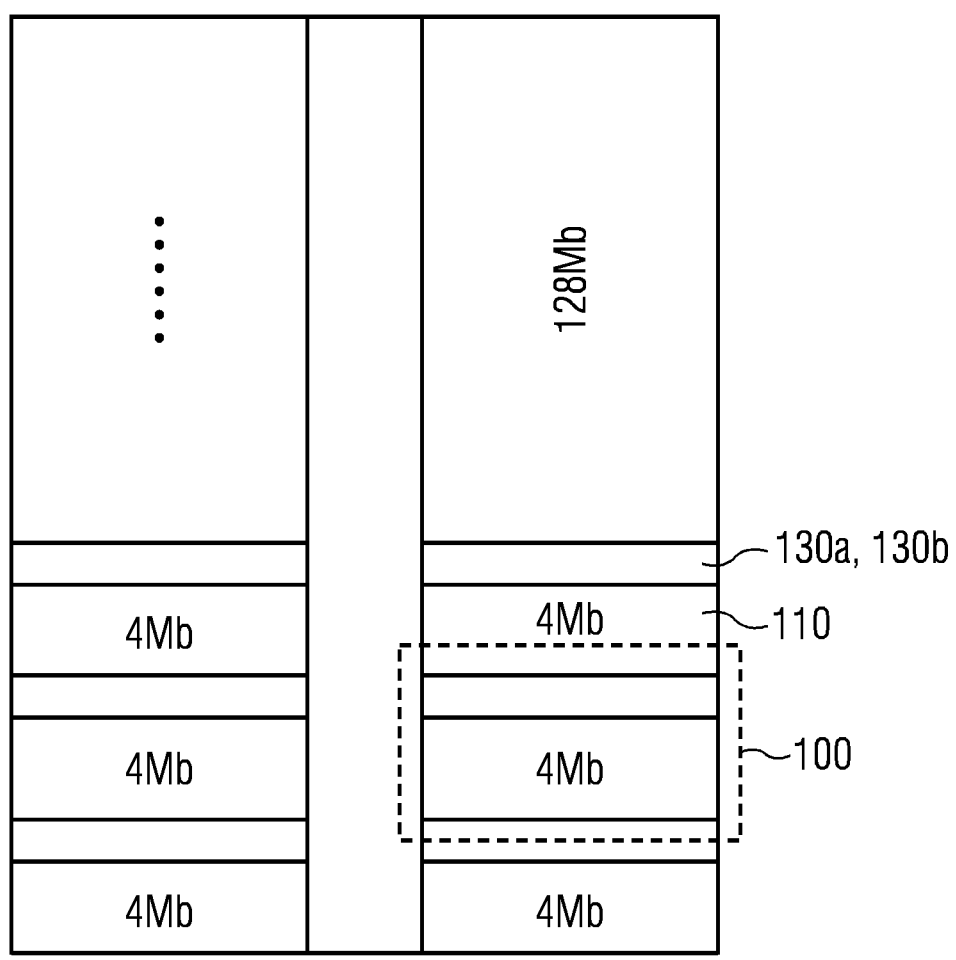
FIG. 2B shows a block diagram of a middle hierarchical view of a DRAM bank according to an example.
Figure 2C:
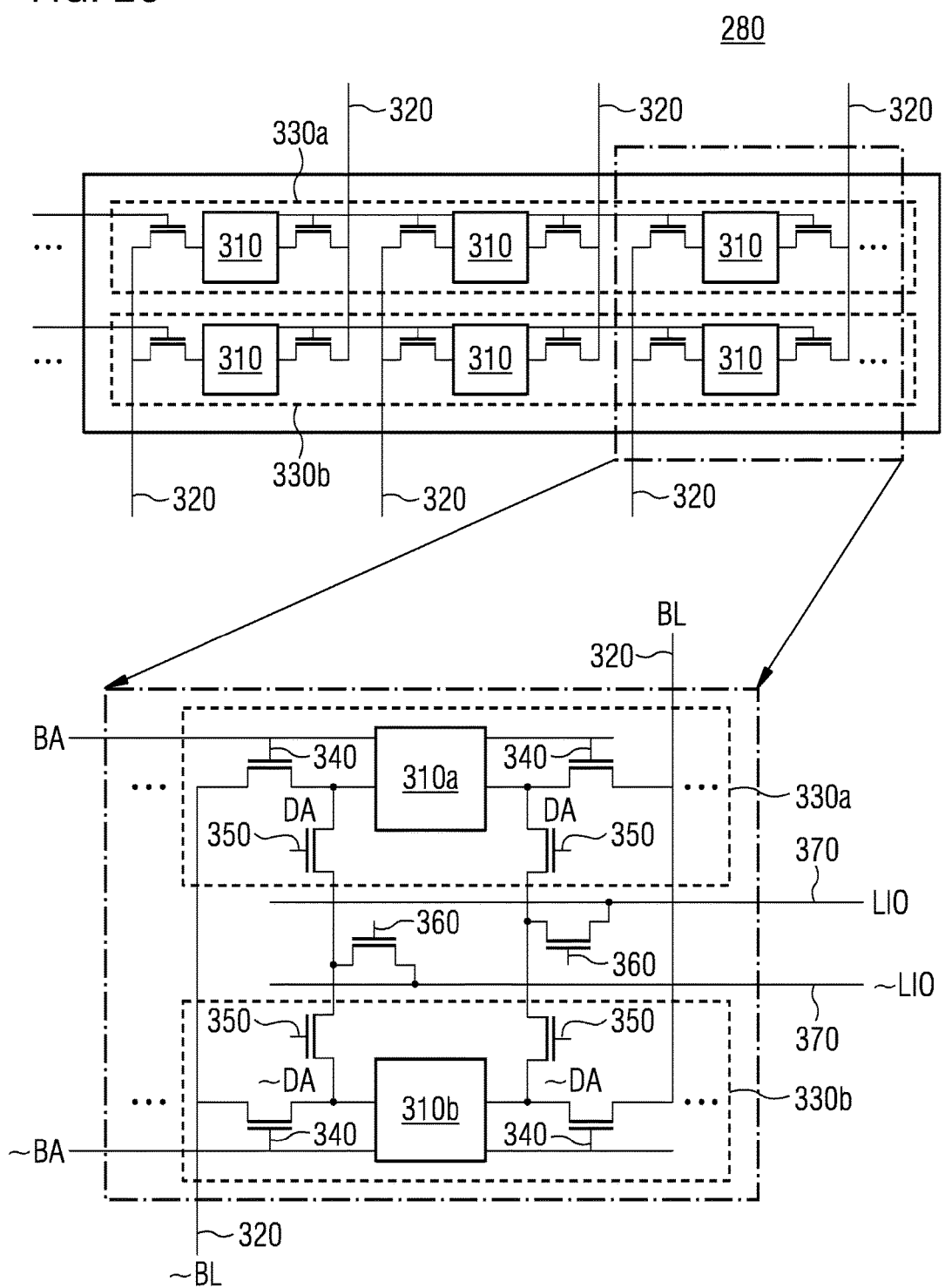
FIG. 2C shows a block diagram of a lower hierarchical view of a DRAM double row buffer with dual sense amplifier sets according to an example.

FIGS. 2A-C give a block diagram of a top-down hierarchical view of the DRB-DRAM and system utilizing said DRB-DRAM, to which concepts proposed herein may be applied. FIG. 2A is a block diagram of a DRAM system 200 utilizing a DRAM chip with a double row buffer of FIG. 1. The DRAM system 200 may be integrated on a chip itself or may comprise several components that are separated. It should be understood that the system may be implemented in many possible combinations and that the DRAM system is not limited to the configuration of FIG. 2A. The DRAM system 200 comprises at least one DRAM die 206 (also known as a DRAM chip). An example of a DRAM system 200 may comprise a plurality of DRAM chips 206, such DRAM chips making up a DRAM module (not shown).

Another example of a DRAM system 200 may comprise a memory controller 250, which is configured to, in part, initiate operations for a DRAM chip or module. The memory controller 250 of an example of the present disclosure may be integrated into a microprocessor 260 or may be separate from microprocessor 260.

The memory controller 250 of microprocessor 260 may be coupled to the common data bus or DRAM chip input/output pad 230 for bidirectional communication of data signals 240. The microprocessor 260 may include at least one memory controller 250 but this number is not to be limiting. If a microprocessor 260 supports multiple memory channel, such a microprocessor 260 may be configured to include a separate memory controller 250 for each memory channel. Data signals 240 may include any combination of DRAM command signals. The microprocessor 260 may be a single or multi-core microprocessor.

The memory controller 250 issues signals to the DRAM chip 206, causing it to, e.g., precharge bit lines within the DRAM chip 206, activate a row of the DRAM chip, and sense contents of the memory cells of a row. These signals may be part of the data signals 240 directed to the DRAM chip or module or to individual components of the DRAM chip 206 itself.

A DRAM chip 206 may have, as an example, one or more DRAM banks 210 sharing input/output means, e.g., I/O pins. FIG. 2B gives a next, lower-tier example of the DRAM system hierarchy according to an example of the present disclosure. Each bank 210 may contain multiple DRB-DRAMs 100 described in FIG. 1.

A DRB-DRAM 100 may contain a DRAM array 110, which contains an array of memory cells organized by row and by column. The DRB-DRAM 100 may also contain two or more row buffers 130a, b.

A row buffer 130a, b holds a most recently accessed row, so any access request to the DRAM array 110 that seeks data of the most recent row will be considered a "hit" and shall be serviced directly from a row buffer. That is, a row in the DRAM array need not be activated if said row has already been sensed to a row buffer. However, if an access command is sent for data outside of that which has been stored in a row buffer, this will be considered a "miss," and another row must be activated. Thus, if a "miss" occurs, then the cycle must be repeated of PRE, ACT, and READ, as issued by the memory controller 250.

A value stored or sensed will be initially destroyed in a row of the DRAM array with every read operation. Automatic write-back of data, or write-recovery is conventionally performed at the end of each READ. In DRB-DRAM, a write-recovery micro-operation RES is issued by the memory controller or generated and handled internally by DRAM control logic to cause a restore from another row buffer than the row buffer used for the preceding read-out.

FIG. 2C provides a more detailed example of the row buffer 130a, b of the DRB-DRAM architecture of the present disclosure. The DRB-DRAM architecture includes one or more dual or double row buffers 330a, 330b, each of which comprise a sense amplifier 310 and electrical components. That is, a double row buffer may be alternatively known as a set of "sense amplifiers". Each row buffer 330a, 330b may include bit line access gate transistors 340 (also known as bit line access connection gates), which respectively assert a bit line access (BA) signal to a bit line 320. Each row buffer 330a, 330b may include data I/O access gate transistors 350 (also known as data I/O access connection gates), which respectively assert a data I/O access (DA) signal to local data I/O lines 370. The sense amplifiers 310a, b in the row buffers are connected to the bit lines 320 via bit line access connection gates 340 controlled by BA signals. Similarly, the sense amplifiers 310a, b are connected to column select transistors 360 (which are eventually connected to local I/O and global IO) via data I/O access connection gates 340 controlled by DA signals.

The double row buffers 330a, 330b are accessed through the bit line access connection gates 340 such that when the bit line access signal is high (BA=1), the bit lines 320 are connected to the sense amplifiers 310a of the first row buffer 330a. Conversely, when the bit line access signal is low (BA=0), the bit lines 320 are connected to the sense amplifiers 310b of the second row buffer 330b.

With data I/O access, if a column select signal (CS) of the column select transistors 360 is low (CS=0), then no data is to be retrieved from either of the two row buffers 330a, 330b and neither row buffer's sense amplifier 310a, 310b is to be connected to a local data I/O line 370. However, if column select is high (CS=1), and if the data access signal is high (DA=1), then the local data I/O line 370 is electrically connected to the sense amplifier 310a of the first row buffer 330a. If the data access signal is low (DA=0), then the local data I/O line 370 is electrically connected to the sense amplifier 310b of the second row buffer 330b. The bit line access signal BA and the data access signal may be respectively toggled, or switched from one state or effect to another, in any manner of timings and data combinations, e.g., DA will change from 0 to 1, or 1 to 0 at a period of time when BA is 0 or 1, etc.

It can thus be understood that, at any given time, only one of the row buffers is connected to the bit lines (BL) and to the data I/O lines (LIO) in a mutually exclusive manner. That is, if one row buffer is connected to a bit line, another cannot be connected to a bit line. Further, if one row buffer is connected to a data I/O line, then another cannot be connected to a data I/O line. Hence, the row buffers 330a, b have inverted access signals to BA and DA.

An advantage to the aforementioned configuration is that it allows for one of the row buffers to holding an active row and to be accessed to the data I/O lines while the second row buffer can restore (or write-recover) its values to the DRAM array. The bit lines of the DRAM array may be precharged while data is still being accessed from another row buffer. This allows decoupling of the local I/O data lines from precharge and charge restore. This technology is used to implement early precharge and late restore, which reduces the critical path latency of row buffer misses.

As a further example of the present disclosure, examples may be implemented using a novel modified RAS timing that is divided into distinct stages or phases of Sense and Restore. As a general overview, a Restore phase according to an example of the present disclosure is controlled with a proposed restore (RES) micro-operation in the DRAM. In another example of the present disclosure, RAS timing is implemented to first sense a selected row, disrupting it in a DRAM array. Subsequently, a RES micro-operation restores a row that had been modified from the previous row cycle (RC). A Disrupted row from this row cycle will be restored in the next row cycle after being modified in a row buffer. The division of RAS timing into two distinct phases allows for implementation of "lazy" restore and early precharge operations, which are operations that may be overlapped with data IO. With the aforementioned implementations, DRAM access latency is decreased for several command sequences having a row buffer miss.

Figure 3A:
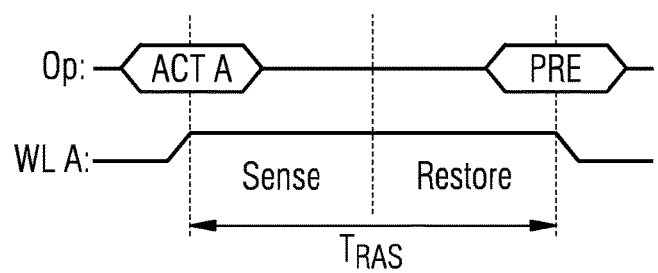
FIG. 3A illustrates a timing diagram of a conventional row address strobe (RAS) operation of a single row buffer system.

FIG. 3A is an example of a conventional method of RAS timing using a single buffer. Utilization of a single buffer in part means that only one row may be cached at a time. As stated above, when a row in the DRAM array is activated (ACT), the row is first sensed in the row buffer through precharged bit lines. At that point, the row in the DRAM array is disrupted, i.e., the data previously stored in the row has been compromised. Data must be restored back into the row in order to preserve the row contents, but conventional DRAM systems only use one row buffer. This means, the sensed row stored in the row buffer must be restored back in the disrupted row to its original location in the DRAM array. The RAS timing thus must include both sense and restore timings in a serial manner, i.e., consecutively performed, where the corresponding row of word-line A of FIG. 3A (WL A) of the selected row remains high, establishing the connection between the DRAM array and the row buffer.

Figure 3B:
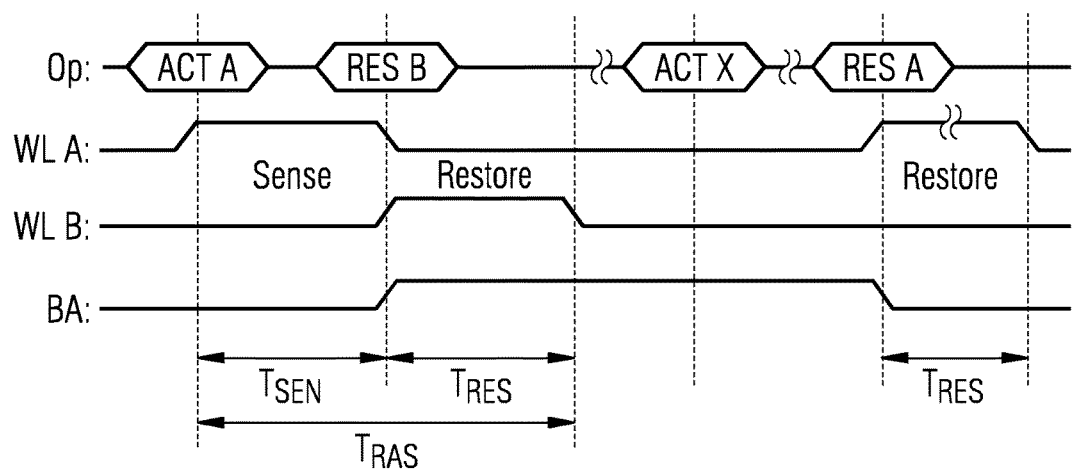
FIG. 3B illustrates a timing diagram of a modified RAS operation using the example DRAM array.

In an example of the present disclosure, the conventional RAS timing is divided into the two phases: Sense and Restore. Thus, the sense and restore timings need not be performed serially but may instead be performed among other operations. FIG. 3B exhibits a new DRAM micro-operation (μOp) called "restore" (RES) to effectively change the conventional RAS operation.

With the micro-operations received, the RAS timing may now be divided into two phases. The initial phase is sensing time $T_{SEN}$, which is the time it takes to sense the row in the row buffer connected to a bit line. Alternatively, $T_{SEN}$ may be thought of as $T_{RAS}$ minus the new time $T_{RES}$ of micro-operation restore. At the end of the sense timing, a selected row is in a row buffer but is consequently disrupted in the array. As a marked difference from the conventional RAS timing method, the row shall be restored in the DRAM array after completion of the current row cycle.

With the DRB DRAM system, more than one row may be processed with the plurality of data row buffers. In the example of FIG. 3B, word-lines A and B are both processed with modified RAS operation with RES μOp. It is assumed in FIG. 3B that word line B has already been sensed in one of the row buffers in a previous row cycle. An operation signal is received to activate word-line A in a DRAM row (ACT A). As such, the bit line access signal goes low (BA=0) to sense word line A into a row buffer that is not currently storing word-line B. Once word line A has been sensed, the RES micro-operation closes the word line of the current row and opens the word line B of the modified row from the previous row cycle (RES B). Concurrent to this, the bit line access signal is toggled to go high (BA=1), which disconnects the bit lines from the sensed row of word-line A and connects the other row buffer containing the modified row (word line B) sensed from the precious row cycle. After a restore timing $T_{RES}$, the modified row will be restored in the DRAM array. The bit line access signal will remain high until a new activate request is received (ACT X), whereby word line A is restored from the row buffer back into the DRAM array (RES A).

The timing diagram of the present disclosure is meant to be a conceptual timing diagram and is not limited to real or exact timings. For example, the timing of the ACT A command may not be exact, e.g., the real, internal word-line rising timing may not align to the ACT A command exactly but may generally be delayed inside the DRAM chip.

Utilizing double row buffers in the DRB DRAM system allows for efficient operation and reduced latency in data cycles. Further implementing the modified RAS timing with double row buffers allows for further reduction in latency through at least two important features: early precharge and "lazy" restore.

In single-buffer DRAM systems with conventional RAS timing, precharge must occur serially after activation of a particular row. However, early precharge, as with an example in the current embodiment, may occur while a particular row has been activated and sensed in a row buffer.

Figure 4A:
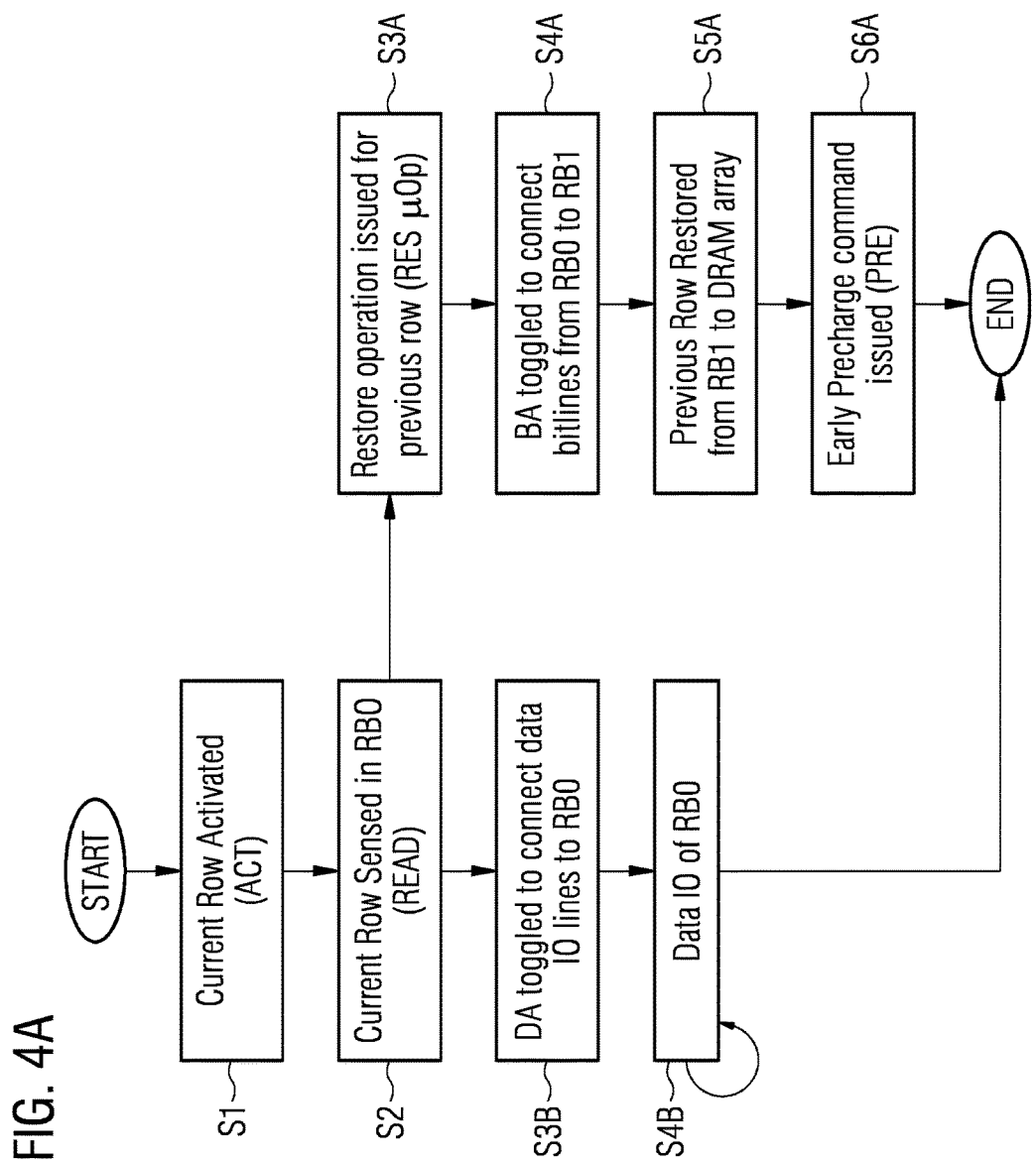
FIG. 4A illustrates a flow chart of a row data cycle from start to end according to an example.

As an example of early precharge, FIG. 4A shows a row data cycle from start to end. In FIG. 4A, a row is activated (ACT) in the DRAM array (S1). The current row is subsequently sensed (READ) in an initial row buffer RB0, which is connected to bit lines in the DRAM array (S2). A restore micro-operation (RES µOp) is issued (S3A), which provides operation to toggle the bit line access signal to connect another row buffer RB1 to the bit lines BL. It is assumed that row buffer RB1 has contents from a previous row cycle. The bit line access signal is switched from 1 to 0, which connects the bit lines BL from an initial row buffer RB0 to the other row buffer RB1 (S4A). Then the previous row in the other row buffer RB1 is restored in the DRAM array (S5A). After the RES µOp has been completed at time $T_{RAS}$ after ACT, an early precharge (PRE) command is executed in the system whereby the bit lines are precharged (S6A). After time $T_{RP}$, indicating the amount of row precharge time or the minimum number of clock cycles required between issuing the precharge command and opening a subsequent row, the bit lines BL and the other row buffer RB1 will be precharged, ready to sense a subsequent row.

Concurrent with the operations of row buffer RB1, the initial row buffer RB0 has been decoupled from the bit lines (S4A). A data I/O access signal is switched from 0 to 1, which connects the data I/O lines (LIO) to the initial row buffer RB0 (S3B). A valid open row is thus held so that data I/O may be performed from the row buffer RB0 (S4B). From FIG. 4A, data I/O (S4B) may therefore be performed in an overlapping timing with bit line precharging (S6A). After the PRE operation, the row data cycle is completed, at time $T_{RAS}+T_{RP}$.

From early precharge, as exhibited above, any subsequent row hit will be served from the initial row buffer RB0 with a latency of time $T_{CL}$, that is, the Column Address Strobe (CAS) latency or the timing of the number of cycles between sending a column address to the DRAM memory and the beginning of the data I/O in response. Any row miss will have a latency of time $T_{RCD}$, that is, the row address to column address delay, or the minimum number of clock cycles required between opening a row of memory and accessing columns within the row, plus time $T_{CL}$ ($T_{RCD}+T_{CL}$). The shortened timing is created as the bit lines and the other row buffer RB1 have already been precharged and are thus ready to be used by the DRAM system.

Figure 4B:
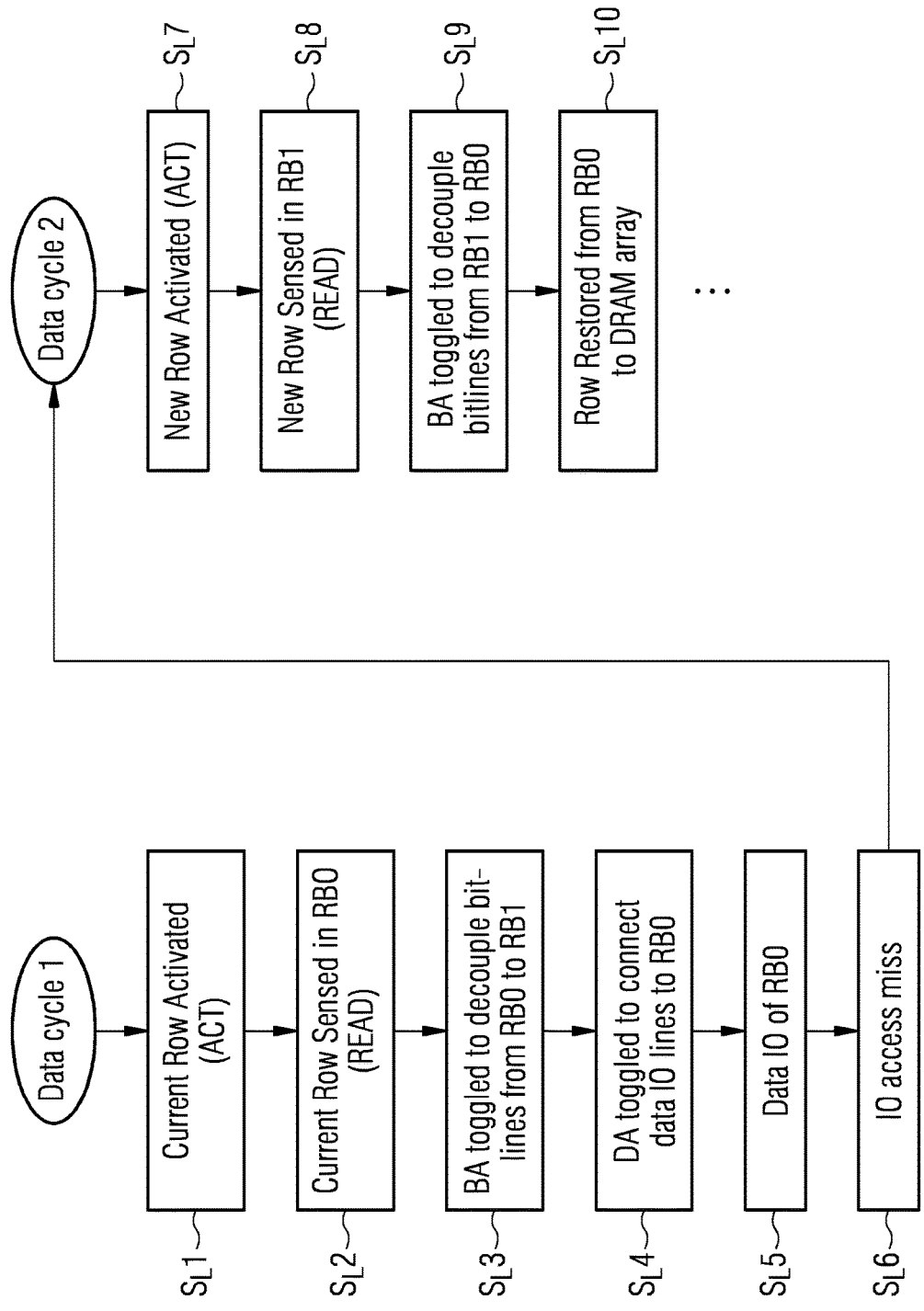
FIG. 4B illustrates a flow chart of a plurality of row data cycles according to an example.

According to an example of the present disclosure, restore works to also reduce system latency. FIG. 4B shows a plurality of data cycles of a row buffer in the double row buffer DRAM system, according to a principle of "lazy" restore. In "lazy" restore, an initial row buffer RB0 is decoupled from bit lines BL ($S_L3$) after a current row is activated and sensed ($S_L1$ and $S_L2$) into the row buffer RB0. Once sensing finishes, all access requests for data are serviced directly from the initial row buffer RB0 holding the current row ($S_L4$ and $S_L5$). However, the row of the DRAM array corresponding to the contents of RB0 has been disrupted. The valid value of the aforementioned row is maintained in RB0.

When an I/O access misses ($S_L6$) the current row active in row buffer RB0, that is, when row buffer RB0 does not contain the address of the I/O access request, an activation request (ACT) is issued ($S_L7$), indicating the start of a new data cycle, and activation for a new row in the DRAM array is immediately serviced, whereby the new row is sensed (READ) into another row buffer RB1 immediately after the activation request ($S_L8$). This is possible since bit lines are already precharged and RB1 is ready to sense a new row, as explained previously. Additionally, in the example of the present disclosure, a middle write-recovery step is avoided and deferred to the next row cycle. Such a step would normally be required after a data I/O (WRITE) and before a precharge; DRB-DRAM allows activating the new row ($S_L7$) without restoring the contents of RB0 to the DRAM array, hence avoiding serialized $T_{WR}$ latency on the critical path.

After sensing the new row has completed, a restore micro-operation (RES µOp) is issued, which connects the initial row buffer RB0 to the bit lines BL ($S_L9$) and which asserts the word-line WL of the row stored in the initial row buffer RB0 ($S_L10$). This restores the disrupted row in the DRAM array according to the modified row in row buffer RB0.

The data cycle above is repeated for each row miss. Thus, it can be understood that an activation request for a new row can be issued immediately after a READ or WRITE hit. The activation request may avoid waiting for serialized latencies of, for example: $T_{RTP}$, i.e., the read to precharge delay or the time that takes between the reading of data in the row and the closing of the row; $T_{RP}$, i.e., the row precharge time; and $T_{WR}$, i.e., the write recovery time or the time that must elapse between the last write command to a row and the precharge of said row.

The examples in FIG. 4A and FIG. 4B describe the case where RB0 acts as serving row buffer and RB1 acts as backing row buffer initially. However, RB0 and RB1 are not limited to this and toggle roles; hence the RB0 and RB1 can be switched in the flow diagrams of FIGS. 4A and 4B.

Figure 5:
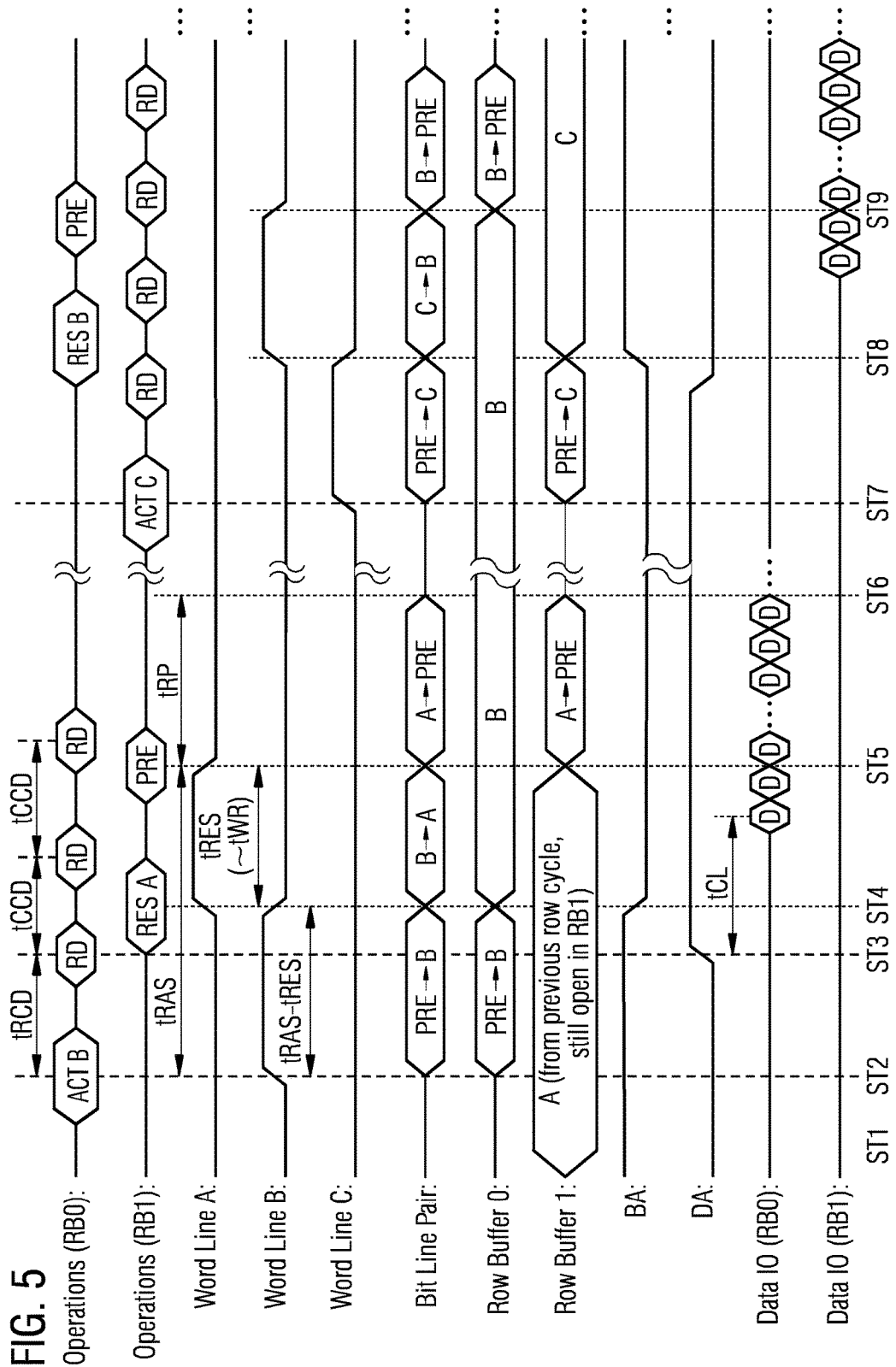
FIG. 5 illustrates a detailed timing diagram of scheduling of one or more data cycles using the example DRAM array.

FIG. 5 is a detailed timing diagram of scheduling of one or more data cycles using the example DRAM array and the modified RAS operation above. It can be understood by those skilled in the art that the timing diagram herein is meant to show relationships between listed stages of the scheduling and is not directed to specific time intervals.

According to a first stage $S_T1$, initial conditions are in place such that a row buffer RB1 (as referenced in, e.g., FIG. 1 as row buffer 130b) holds row A, which has been modified from a previous row cycle. Row buffer RB1 is connected to local data I/O lines such that the data access signal DA=0. After opening the row A for data access, at least $T_{RC}$ amount of time has passed, implying that the bitline BL has been precharged. The bit line BL is connected to a row buffer RB0 (as referenced in, e.g., FIG. 1 as row buffer 130a) such that the bit line access signal BA=1.

According to a second stage $S_T2$, an access request has been made for row B. An activation operation (ACT B) is sent from a memory controller and arrived to the DRAM requesting that row B be activated in the DRAM array. The word-line B goes high, and row buffer RB0 starts sensing row B through the precharged bit lines (PRE→B).

According to a third stage $S_T3$, time $T_{RCD}$ has elapsed after receiving the activation operation, corresponding to the delay of translating row address and column address. A read (RD) command is sent by the memory controller to read data of row B from the row buffer RB0. The data access signal switches to DA=1 such that row buffer RB0 is connected to the local data I/O lines.

According to a fourth stage $S_T4$, the first part, Sensing, of a modified RAS timing has elapsed at time $T_{RAS}$ minus $T_{RES}$. At this time, row B has been fully sensed in row buffer RB0. Both rows A and B are disrupted in the DRAM array at the onset of the fourth stage, but row A is to be restored. As such, the bit line access signal is toggled to BA=0 to connect the bit line BL to row buffer RB1. Word-line A is asserted to restore (RES A) modified row A in row buffer RB1 to its corresponding location in the DRAM array. During this stage, time $T_{CL}$, or CAS latency, may elapse such that data D may now be sent as a response to the RD command.

According to a fifth stage $S_T5$, the second part, Restore, of the modified RAS timing has elapsed (B→A), as measured from the fourth stage, at time $T_{RES}$. The total time elapsed from the activation request ACT B is $T_{RAS}$ (or $T_{SEN}+T_{RES}$). That is, row A has been restored from row buffer RB1 back into the DRAM array. Meanwhile, row buffer RB0 serves column accesses to the open row B. Now that $T_{RAS}$ is completed, a precharge operation (PRE) is immediately started to precharge bit lines and row buffer RB1 (A→PRE).

According to a sixth stage $S_T6$, the precharge PRE has been completed. From now on, any access request (read RD/write WR) to the current row will be served from row buffer RB0. If the access request results in a miss, the bit line BL has already been precharged and row buffer RB1 has been connected to the bit line BL so as to be ready to sense a new row.

According to a seventh stage $S_T7$, a new row cycle is started with the arrival of an access request for row C. Access requests to the open row B in row buffer RB0 are still served directly. However word line C goes high such that row buffer RB1 starts to immediately sense row C through precharged bit lines (PRE→C).

According to an eighth stage $S_T8$, row buffer RB0 still holds the modified row B but the data I/O access signal has been switched such that DA=0, connecting the local data I/O lines to row buffer RB1. The original location of row B has been disrupted in the DRAM array. Therefore, after row C has been fully sensed in row buffer RB1, the word-line WL of row B goes high and the bit line access signal BA=1, which connects the row buffer RB0 to the BL in order to restore (RES B) modified row B back in the DRAM array (RES).

According to a ninth stage $S_T9$, row B has been fully restored back in the DRAM array (C→B) such that time $T_{RAS}$ has again elapsed. The bit lines and row buffer RB0 are ready to be precharged (B→PRE). Meanwhile, row buffer RB1 is holding the open row C and performing column IO.

The stages repeat as part of a data row cycle, which starts upon receipt of a row activation request.

Figure 6:
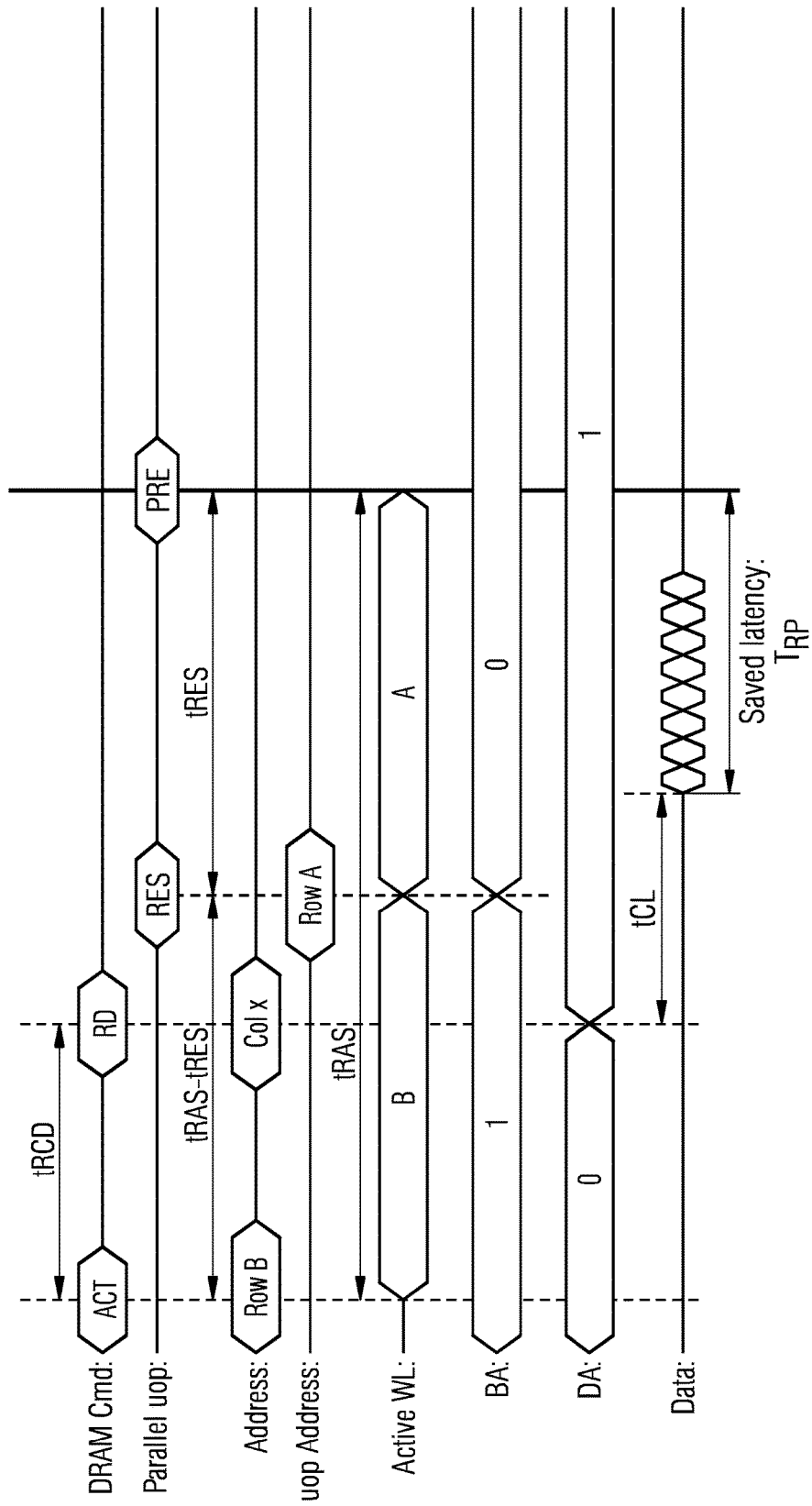
FIG. 6 illustrates a detailed timing diagram of a read variation using the example DRAM array.

The above examples decrease the latency required to, e.g., open a subsequent row as measured from issuing the precharge command. This is particularly exhibited when encountering an open page miss. As seen in FIG. 6, row A has been open and data I/O has been performed through RB1. However, because the bit lines and row buffer RB0 have been precharged during data I/O from RB1 holding row A, any access request to row B will be started immediately, saving latency $T_{RP}$.

Figure 7:
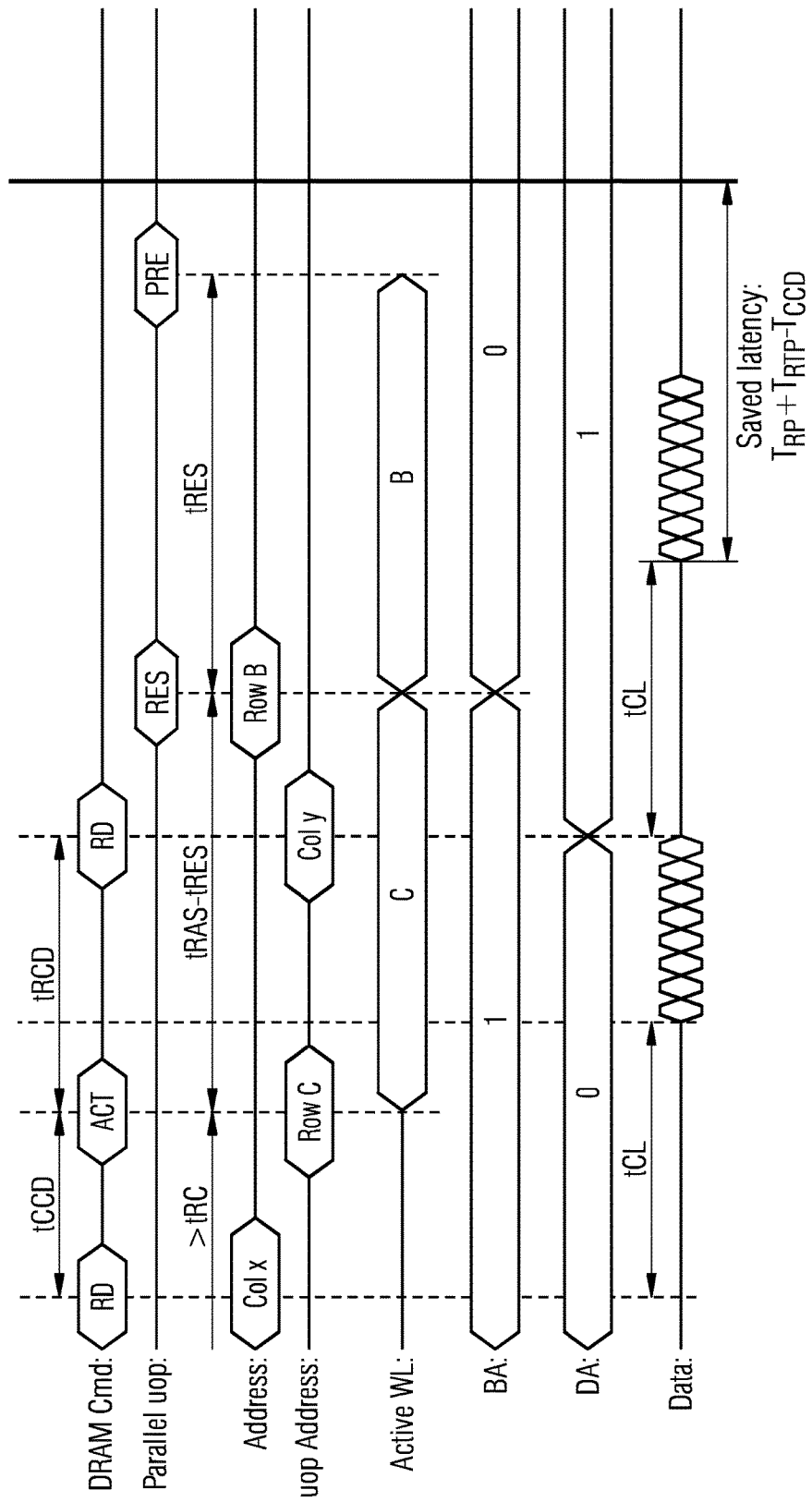
FIG. 7 illustrates a detailed timing diagram of a second read variation using the example DRAM array.

Similarly, as seen in FIG. 7, row B has been open and read from a first column X, and then row C has been made open and read from a second column Y. Conventional DRAM needs to wait for timing $T_{RTP}$, i.e., the read to precharge delay, to issue the precharge after the READ operation to column X in row B. Then, it waits for timing $T_{RP}$ for the precharge. Finally, there is a wait of timing $T_{RCD}$ and $T_{CL}$ to get the column Y in row C. In contrast, DRB-DRAM only waits for timing $T_{CCD}$ to send the ACT for row C after the READ column X in row B, since the bit lines are already precharged and RB0 is ready to sense a new row, assuming that more than timing $T_{RC}$ elapsed in the current row cycle while performing data I/O on row B. Then similarly, DRB-DRAM waits for timings $T_{RCD}$ and $T_{CL}$ to get the column Y. The latency that can be saved amounts to $T_{RP}$ plus $T_{RTP}$, i.e., the read to precharge delay, minus $T_{CCD}$, i.e., the minimum column-to-column command delay.

Figure 8:
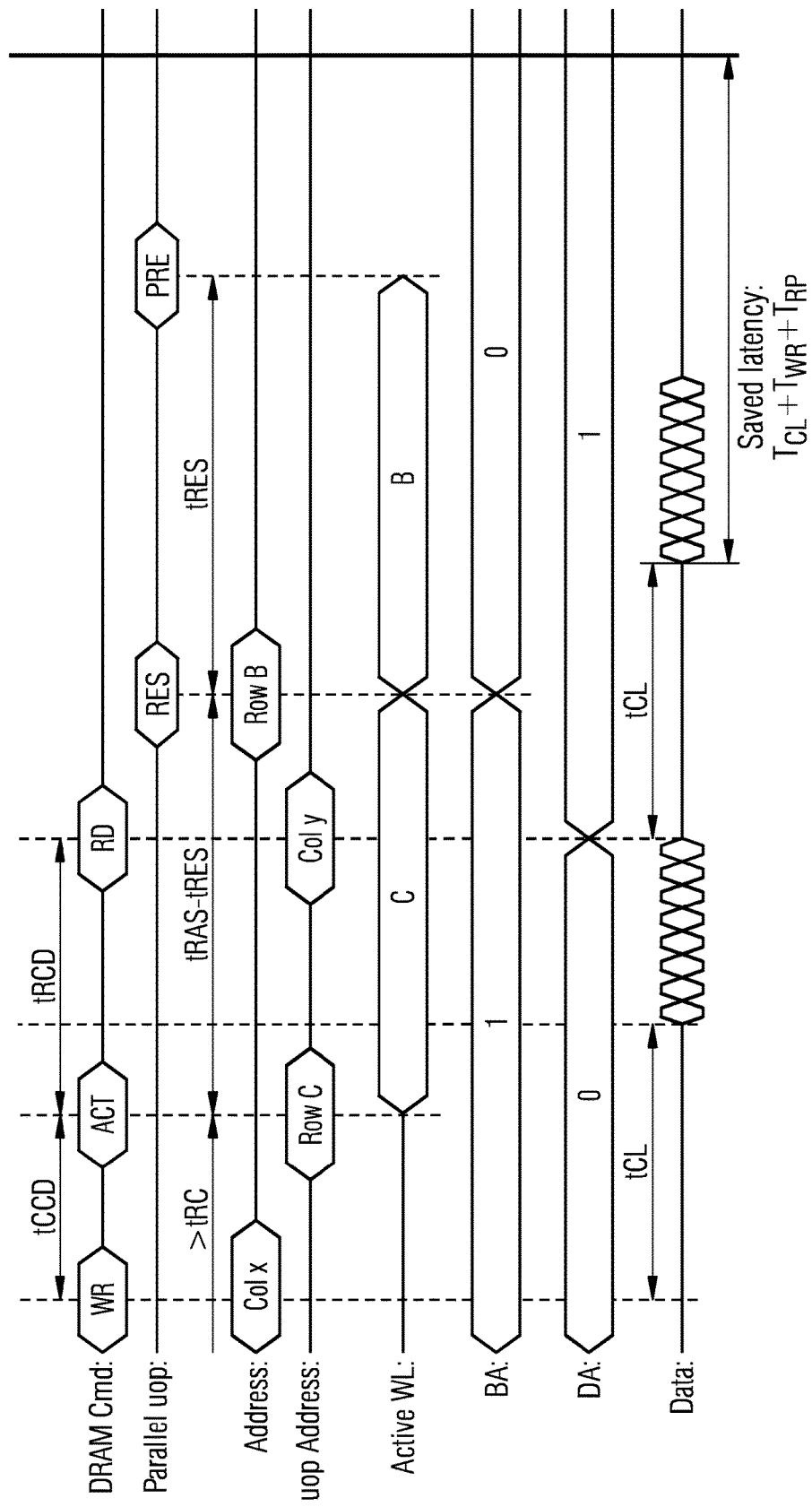
FIG. 8 illustrates a detailed timing diagram of a write variation using the example DRAM array.

Further, as seen in FIG. 8, row B has been open and written to at a first column X, and then row C has been made open and read from a second column Y. Conventional DRAM first waits for the timings $T_{CL}$ and $T_{CCD}$ for writing into column X in the open row B. Then, it needs to wait for timing $T_{WR}$ to restore the updated row buffer to the array. Afterwards, it issues a precharge and waits for timing $T_{RP}$. Finally, conventional DRAM activates the new row C and reads column Y after timings $T_{RCD}$ and $T_{CL}$. In contrast, for DRB-DRAM, again assuming that at least $T_{RC}$ amount of time elapsed in the current row cycle, activating row C can be issued in timing $T_{CCD}$ after the writing column X in the open row B, which is held in RB1. Afterwards, DRB-DRAM waits for $T_{RCD}$ and $T_{CL}$ amount of time to activate row C in RB0 and read column Y. Updated row B in RB1 is restored with the RES μOp in the next row cycle, overlapped with the data I/O from RB0, which holds the new row C. The latency that can be saved amounts to $T_{CL}$, i.e., the CAS latency, plus $T_{WR}$, i.e., the write-recovery latency, plus $T_{RP}$.

As memory latency is an important bottleneck in performance and power, implementation of a double row buffer DRAM system and/or modified RAS timing reduces the memory access latency to the DRAM. Specifically, the examples of the present disclosure keeps the low latency access of row buffer hits while reducing the long latency command sequences having a row buffer miss, e.g., a read RD/write WR hit and then miss. The examples give the ability to a DRAM array to keep an open row while providing the low latency miss benefit of a closed row. Aforementioned advantageous effects are realized, considering DRAM/eDRAM based memories implemented as last level cache, multi-level memory and main memory.

Furthermore, implementing examples of the present disclosure of the proposed DRAM architecture only changes the row buffer circuitry and I/O circuitry, keeping a DRAM cell array unchanged. Hence, the disclosed approaches will be a cost effective option to implement and adapt such technology.

The proposed DRAM architecture may be implemented in conjunction with other DRAM systems. A marked advantage may be seen, however, when using a double row buffer DRAM array and/or modified RAS timing.

Dual row buffers may increase area overhead of the DRAM since the number of sense amplifiers are doubled in the DRAM along with extra connection gate transistors per array. In one example, there exists several variations of doubling the number of DRAM banks (while keeping the DRAM capacity as the same). Doubling the number of DRAM banks increases the available parallelism and decreases the likelihood of bank conflicts. Twice as many banks can possibly reduce the chances of consecutive accesses that lead to a row miss to be mapped onto a same bank.

However, changing the number of DRAM banks does not give the same performance benefit as implementing a double row buffer system. Increasing DRAM bank numbers cannot, by itself, reduce the critical path latency of a row miss. The miss latency issue is further not solved when the consecutive accesses are mapped onto the same bank.

A DRB-DRAM example as disclosed provides a solution congruent to the doubling the number of banks in DRAM. By decoupling precharge, restore, and data I/O operations so that they are not serially performed, a DRB-DRAM may issue early precharge and deferred restore while performing I/O. As such, a proposed DRB-DRAM solution can reduce the critical path latency of a row buffer miss.

Furthermore, DRB-DRAM can reduce the long latency of a row buffer miss even within a single bank without depending on parallelism of multiple banks. Both bank increase and DRB-DRAM may be implemented together, but it is noted that doubling the number of banks only reduces the chances of a row buffer miss. When a row miss happens, DRB-DRAM can reduce the latency cost of said miss.

In one example, there exists several variations of cached DRAM, such as Virtual Channel SDRAM (VCRAM) and Enhanced SDRAM (ESDRAM). These proposals manage to keep multiple rows open, which increase the probability of row buffer hit. When a row is open in the cache structure, a DRAM array can be precharged for the next access. However, the solution of a cached DRAM still suffer from the fact that the updated rows in the cache structure need to be written back into the DRAM array in a serialized way during the switching of rows. Implementation of the proposed DRAM architecture of the present disclosure avoids the need for serialization.

The skilled person having benefit from the present disclosure will appreciate that the various examples described herein can be implemented individually or in combination.

A first example is a dynamic random access memory (DRAM) array, comprising row buffers; and a plurality of bit lines connectable, respectively, to at least two row buffers of the row buffers.

In example 2, in the DRAM array of example 1, the at least two row buffers are respectively connectable to data input/output (I/O) lines.

In example 3, in the DRAM array of example 2, wherein the at least two row buffers are configured to electrically connect the at least two row buffers to the bit lines and data I/O lines in a mutually exclusive manner.

In example 4, in the DRAM array of examples 1 to 3, the plurality of bit lines are coupled, respectively, to the at least two row buffers via a bit line access gate transistor, whereby when one of the at least two row buffers is electrically connected to a bit line, another of the at least two row buffers is not electrically connected to a bit line.

In example 5, in the DRAM array of examples 2 to 4, the plurality of data I/O lines are coupled, respectively, to the at least two row buffers via a data I/O access gate transistor, whereby when one of the at least two row buffers is electrically connected to a data I/O line, another of the at least two row buffers is not electrically connected to a data I/O line.

Example 6 is a dynamic random access memory (DRAM) chip comprising at least one DRAM array of any of examples 1 to 5.

In example 7, in the DRAM chip of example 6, the plurality of bit lines of the DRAM array are coupled, respectively, to the at least two row buffers via a bit line access gate transistor, wherein when one of the two row buffers is electrically connected to a bit line, another of the at least two row buffers is not electrically connected to a bit line.

In example 8, the DRAM chip of example 6 or 7 further comprises a signal interface configured to receive a first micro-operation for sensing that causes a sensing of a first row of the DRAM array in a row cycle; and a second micro-operation for restoring that causes a restoring of contents of a second row of the DRAM array in the row cycle.

Example 9 is a method for initiation of micro operations at a dynamic random access memory (DRAM) array comprising initiating a micro-operation for sensing a first row of the DRAM array in a row cycle; and initiating a micro-operation for restoring contents of a second row of the DRAM array in the row cycle.

In example 10, in the method of example 9, initiating the micro-operation for sensing is separable from initiating the micro-operation for restoring.

In example 11, in the method of example 10, initiating the micro-operation for sensing causes a sensing of a first row of the DRAM array with a first row buffer of the DRAM array connected via a bit line in a first row cycle, and initiating the micro-operation for restoring causes a restoring of contents of a second row buffer to a second row of the DRAM array in the first row cycle.

In example 12, the method of any of examples 9 to 11 further comprise initiating a micro-operation for precharging bit lines of the DRAM array in the row cycle.

Example 13 is a dynamic random access memory (DRAM) system, comprising a DRAM chip of any of examples 6 to 8 and at least a DRAM controller configured to initiate micro operations for the DRAM chip.

In example 14, in the DRAM system of example 13, the DRAM controller comprises: an output interface configured to output a micro-operation for sensing that causes a sensing of a first row of the DRAM array into a first row buffer in a first row cycle; and to output a micro-operation for restoring contents that causes a restoring of a second row of the DRAM array from a second row buffer in the first row cycle.

In example 15, in The DRAM system of example 13 or 14, the output interface of the DRAM controller is further configured to output a micro-operation for precharging that causes a precharging of bit lines of the DRAM array in the first row cycle.

Example 16 is a method of accessing a dynamic random access memory (DRAM) array, the method comprising sensing a first row of the DRAM array with a first row buffer connected via bit lines in a first row cycle; coupling the bit lines to a second row buffer of the DRAM array; and restoring contents of the second row buffer to a second row of the DRAM array in the first row cycle.

In example 17, the method of accessing a DRAM array of example 16 further comprises precharging the bit lines in the first row cycle after restoring contents of the second row buffer to the second row of the DRAM array.

In example 18, in the method of accessing a DRAM array of any of examples 16 or 17, coupling the bit lines to the first row buffer or second row buffer of the DRAM array comprises toggling a bit line access signal.

In example 19, the method of accessing a DRAM array of any of examples 16 to 18 further comprises coupling a data input/output (I/O) line to the first row buffer of the DRAM array in the first row cycle.

In example 20, in the method of accessing a DRAM array of example 19, coupling the data I/O lines to the first row buffer or the second row buffer of the DRAM array comprises toggling a data I/O access signal.

In example 21, the method of accessing a DRAM array of any of examples 16 to 20 further comprises receiving an access request to sense a third row of the DRAM array in a second row cycle; and sensing the third row of the DRAM array with the second row buffer of the DRAM array.

In example 22, in the method of accessing a DRAM array of example 21, receiving an access request to sense a third row is performed after precharging the bit lines of the DRAM array in the first row cycle.

In example 23, the method of accessing a DRAM array of any of examples 16 to 22, further comprises coupling the bit line to the first row buffer of the DRAM array; and restoring contents of the first row buffer to a row of the DRAM array in the second row cycle.

The aspects and features mentioned and described together with one or more of the previously detailed examples and figures, may as well be combined with one or more of the other examples in order to replace a like feature of the other example or in order to additionally introduce the feature to the other example.

Examples may further be a computer program having a program code for supporting one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means," "means for providing a sensor signal," "means for generating a transmit signal," etc., may be implemented in the form of dedicated hardware, such as "a signal provider," "a signal processing unit," "a processor," "a controller," etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and nonvolatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A dynamic random access memory (DRAM) array, comprising:
   row buffers; and
   a plurality of bit lines, wherein each bit line of the plurality of bit lines is connectable to at least two row buffers of the row buffers,
   wherein the plurality of bit lines are coupled, respectively, to the at least two row buffers via a bit line access gate transistor, whereby when one of the at least two row buffers is electrically connected to the plurality of bit lines, another of the at least two row buffers is not electrically connected to the plurality of bit lines,
   wherein the at least two row buffers are respectively connectable to data input/output (I/O) lines,
   wherein the data I/O lines are coupled, respectively, to the at least two row buffers via a data I/O access gate transistor, whereby when one of the at least two row buffers is electrically connected to the data I/O lines, another of the at least two row buffers is not electrically connected to the data I/O lines.

2. The DRAM array of claim 1, wherein the at least two row buffers are configured to electrically connect to the plurality of bit lines and data I/O lines in a mutually exclusive manner.

3. A dynamic random access memory (DRAM) chip comprising at least one DRAM array, the DRAM array comprising:
 row buffers;
 a plurality of bit lines, wherein each bit line of the plurality of bit lines is connectable to at least two row buffers of the row, and
 a signal interface configured to receive a first micro-operation for sensing that causes a sensing of a first row of the DRAM array in a row cycle; and a second micro-operation for restoring that causes a restoring of contents of a second row of the DRAM array in the row cycle,
 wherein the plurality of bit lines are coupled, respectively, to the at least two row buffers via a bit line access gate transistor, whereby when one of the at least two row buffers is electrically connected to the plurality of bit lines, another of the at least two row buffers is not electrically connected to the plurality of bit lines.

4. A method for initiation of micro operations at a dynamic random access memory (DRAM) array comprising:
 initiating a micro-operation for sensing a first row of the DRAM array in a row cycle;
 initiating a micro-operation for restoring contents of a second row of the DRAM array in the row cycle; and
 initiating a micro-operation for precharging bit lines of the DRAM array in the row cycle.

5. The method of claim 4, wherein initiating the micro-operation for sensing is separable from initiating the micro-operation for restoring.

6. The method of claim 5,
 wherein initiating the micro-operation for sensing causes a sensing of a first row of the DRAM array with a first row buffer of the DRAM array connected via a bit line in a first row cycle; and
 wherein initiating the micro-operation for restoring causes a restoring of contents of a second row buffer to a second row of the DRAM array in the first row cycle.

7. A method of accessing a dynamic random access memory (DRAM) array, the method comprising:
 sensing a first row of the DRAM array with a first row buffer connected via bit lines in a first row cycle;
 coupling the bit lines to a second row buffer of the DRAM array; and
 restoring contents of the second row buffer to a second row of the DRAM array in the first row cycle.

8. The method of accessing a DRAM array of claim 7, the method further comprising:
 precharging the bit lines in the first row cycle after restoring contents of the second row buffer to the second row of the DRAM array.

9. The method of accessing a DRAM array of claim 7, wherein coupling the bit lines to the first row buffer or second row buffer of the DRAM array comprises toggling a bit line access signal.

10. The method of accessing a DRAM array of claim 7, the method further comprising:
 coupling a data input/output (I/O) line to the first row buffer of the DRAM array in the first row cycle.

11. The method of accessing a DRAM array of claim 10, wherein coupling the data I/O lines to the first row buffer or the second row buffer of the DRAM array comprises toggling a data I/O access signal.

12. The method of accessing a DRAM array of claim 7, the method further comprising:
 receiving an access request to sense a third row of the DRAM array in a second row cycle; and
 sensing the third row of the DRAM array with the second row buffer of the DRAM array.

13. The method of accessing a DRAM array of claim 12, wherein receiving an access request to sense a third row is performed after precharging the bit lines of the DRAM array in the first row cycle.

14. The method of accessing a DRAM array of claim 7, the method further comprising:
 coupling the bit line to the first row buffer of the DRAM array; and
 restoring contents of the first row buffer to a row of the DRAM array in the second row cycle.

* * * * *